United States Patent [19]

Yanagawa et al.

[11] Patent Number: 5,228,193
[45] Date of Patent: Jul. 20, 1993

[54] ELECTRONIC PARTS MOUNTING METHOD

[75] Inventors: Masatoshi Yanagawa, Katano; Noriaki Yoshida, Ikeda; Masao Iritani, Shijonawate; Akira Mouri, Hirakata; Takashi Noyama, Suita; Satoshi Tanaka, Higashiosaka, all of Japan

[73] Assignee: Matsushita Electric Industrial Co., Ltd., Osaka, Japan

[21] Appl. No.: 783,999

[22] Filed: Oct. 29, 1991

[30] Foreign Application Priority Data

Oct. 29, 1990 [JP] Japan .................................. 2-292404

[51] Int. Cl.$^5$ .............................................. H05K 3/30
[52] U.S. Cl. ......................................... 29/832; 29/740; 29/741; 29/759; 221/3; 221/6
[58] Field of Search ................. 29/740, 739, 741, 833, 29/759; 221/3, 6

[56] References Cited

U.S. PATENT DOCUMENTS

| | | | |
|---|---|---|---|
| 4,653,669 | 3/1987 | Hineno et al. | 29/740 X |
| 4,670,976 | 6/1987 | Stridsberg et al. | 29/740 |
| 4,690,302 | 9/1987 | Zebley et al. | 29/741 X |
| 4,733,459 | 3/1988 | Tateno | 29/741 |
| 4,775,280 | 10/1988 | Kelley | 29/741 X |
| 4,980,970 | 1/1991 | Uchida et al. | 29/740 |

Primary Examiner—Carl J. Arbes
Attorney, Agent, or Firm—Wenderoth, Lind & Ponack

[57] ABSTRACT

An electronic parts mounting method for taking out from a parts supply device having a plurality of electronic parts at least one of the electronic parts, and mounting the part at a predetermined position of a substrate to be manufactured, includes steps of storing quantity of parts, which is held by each parts supply device, in a storing section provided in each parts supply device, rewriting the quantity of parts according to number of parts taken out from the parts supply device by a calculating section provided in each parts supply device, reading out an initial value of the quantity of parts held by each parts supply device, by a control section provided in an electronic parts mounting machine, calculating one of the quantity of parts required for the substrate and period of time required for mounting the part on the substrate by a calculating section provided in the electronic parts mounting machine, and carrying out, in advance, a parts shortage advance notification in each parts supply device based on a result of the calculating step.

12 Claims, 9 Drawing Sheets

Fig. 8

| Z NUMBER | PARTS NAME | QUANTITY OF REMAINING PARTS | QUANTITY OF PARTS TO BE USED |
|---|---|---|---|
| 1 | CHIP1 | 600 | 125 |
| 2 | CHIP33 | 1110 | 801 |
| 3 | CHIP5 | 565 | 99 |
| 4 | QFP51 | 85 | 10 |
| 5 | QFP111 | 111 | 8 |
| 6 | PLCC12 | 123 | 22 |
| ...... | ...... | ...... | ...... |

ELECTRONIC PARTS MOUNTING METHOD

BACKGROUND OF THE INVENTION

The present invention relates to a method for providing advance notification of a parts shortage in a parts supply device of an electronic parts mounting machine.

An example of a conventional method for providing advance notification of a shortage of parts in a parts supply device mounted on an electronic parts mounting machine is described below.

FIG. 9 is a perspective view showing an electronic parts mounting machine 101. Reference numeral 102 denotes an operation panel of the electronic parts mounting machine 101 and reference numeral 103 denotes a monitor screen of the electronic parts mounting machine 101.

Conventionally, an operator manually inputs into the electronic parts mounting machine 101 an initial value denoting the quantity of parts held by the parts supply device 104 and an advance notification value denoting a parts shortage quantity by means of the operation panel 102. The electronic parts mounting machine 101 rewrites the quantity of parts held by each parts supply device 104 according to a parts mounting operation, and when the advance notification value has been attained, the operator is notified of a parts shortage by means of the monitor screen 103 in advance of the total exhaustion of parts.

However, the above-described method for providing advance notification of the shortage of parts held by the parts supply device in the electronic parts mounting machine has the following disadvantages:

(1) It is necessary for the operator to manually input to the mounting machine the initial value denoting the quantity of parts held by each parts supply device 104 and the advance notification value denoting a parts shortage quantity by means of the operation panel 102 and the monitor screen 103. In recent years it has become the practice to set tens to hundreds of parts supply devices on the electronic parts mounting machine 101, so that the above operation takes much time and labor and in addition, an erroneous input may occur. Further, when the parts supply device 104 which has been removed from the electronic parts mounting machine 101 is set thereon again, the operator does not know the quantity of parts held by each parts supply device and the operator thus cannot input the initial value denoting the quantity of parts mounted thereon into the electronic parts mounting machine 101.

(2) If a parts shortage suddenly occurs in the electronic parts mounting machine 101 without the time of the occurrence of the parts shortage being known, a parts mounting operation is suspended until another parts supply device 104 is prepared, and the operation rate of the electronic parts mounting machine 101 decreases.

(3) The operator does not know tho number of substrates comprising electronic parts set on the electronic parts mounting machine 101 in managing the number of substrates to be manufactured for the switch of one kind machine to another kind of machine.

SUMMARY OF THE INVENTION

Accordingly, an object of the present invention is to provide a method for providing advance notification to an operator of the shortage of parts held by each parts supply device in an electronic parts mounting machine, in which previous notification is given as to the order of the occurrence of a parts shortage in each parts supply device, the time of the occurrence of a parts shortage, and the number of substrates which can be manufactured, whereby the operator's parts shortage managing operation can be simplified and the operation rate of the electronic parts mounting machine can be improved by reducing the period of time for replacing one parts supply device with another due to the occurrence of a parts shortage.

In accomplishing these and other objects, according to one aspect of the present invention, there is provided an electronic parts mounting method for taking out from a parts supply device having a plurality of electronic parts at least one of the electronic parts, and mounting the part at a predetermined position of a substrate to be manufactured, comprising steps of:

storing a quantity of parts, which is held by each parts supply device, in a storing section provided in each parts supply device;

rewriting the quantity of parts according to number of parts taken out from the parts supply device by a calculating section provided in each parts supply device;

reading out an initial value of the quantity of parts held by each parts supply device, by a control section provided in an electronic parts mounting machine;

calculating one of the quantity of parts required for the substrate and period of time required for mounting the part on the substrate by a calculating section provided in the electronic parts mounting machine; and carrying out in advance a parts shortage advance notification in each parts supply device based on a result of the calculating step.

As described above, according to the present invention, the operator is given advance notification of the order of the occurrence of a parts shortage in each parts supply device and the occurrence time of each parts shortage. Thus, the operator's parts shortage managing operation can be simplified and the operation rate of the electronic parts mounting machine can be improved by reducing the period of time for replacing one parts supply device with another due to the occurrence of a parts shortage.

BRIEF DESCRIPTION OF THE DRAWINGS

These and other objects and features of the present invention will become clear from the following description taken in conjunction with the preferred embodiments thereof with reference to the accompanying drawings, in which:

FIG. 8 is a display screen associated with the fourth and fifth embodiments.

DETAILED DESCRIPTION OF THE EMBODIMENTS

Figure 1:
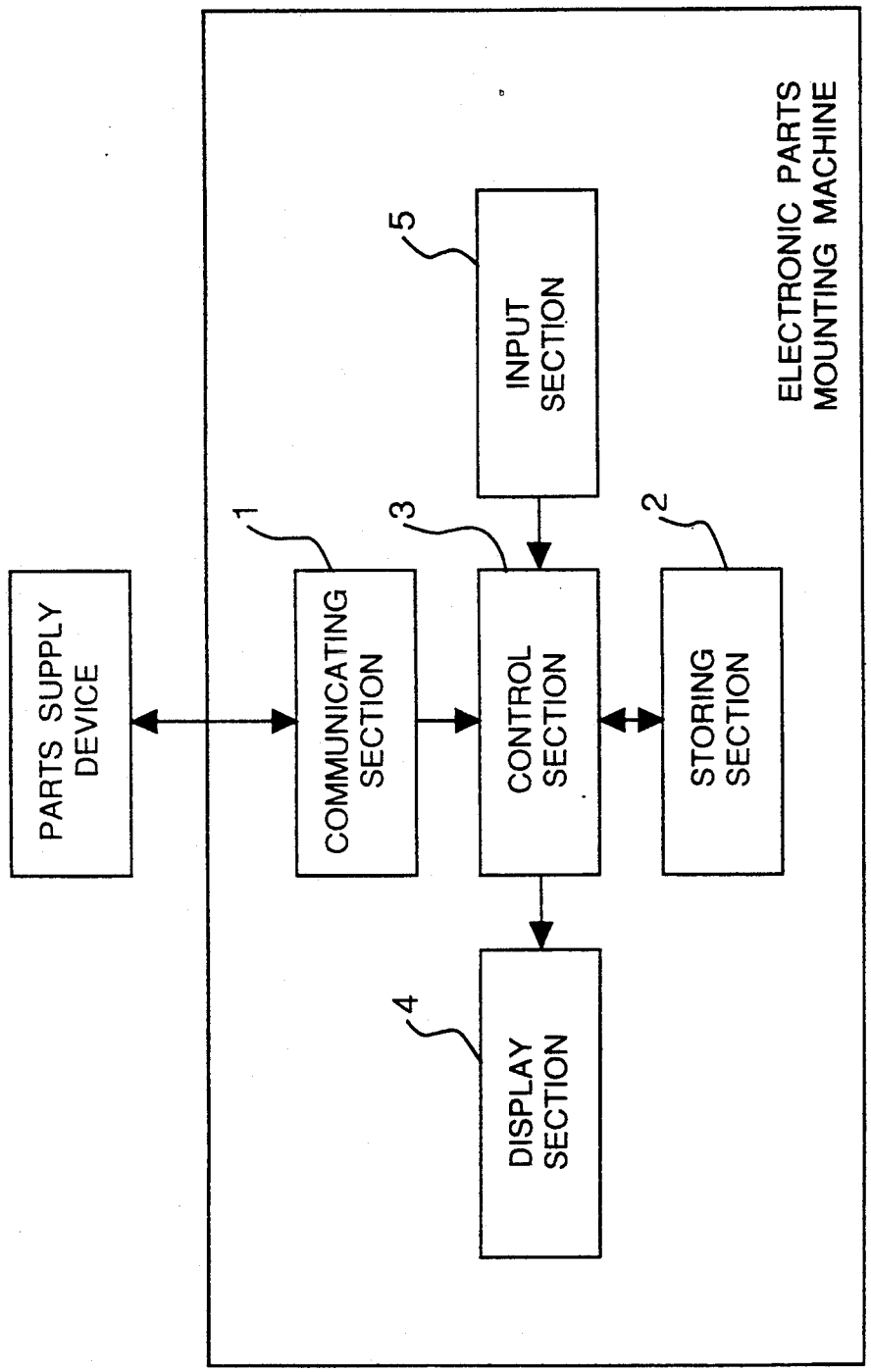
FIG. 1 is a functional block diagram showing an apparatus for providing advance notification of an electronic parts shortage in an electronic parts mounting machine according to an embodiment of the present invention.

Before the description of the present invention proceeds, it is to be noted that like parts are designated by like reference numerals throughout the accompanying drawings.

Referring to drawings, a method for advance notification of a parts shortage in a parts supply unit of an electronic parts mounting machine according to an embodiment of the present is described below.

FIG. 1 is a block diagram showing a method for providing advance notification of a parts shortage in an electronic parts mounting machine. In FIG. 1, the electronic parts mounting machine comprises a communicating section 1 for reading out data of the name and quantity denoting parts held by a parts supply device; a storing section 2 for storing data denoting the substrate production program of various kinds of apparatuses to be manufactured, data denoting the period of time required for mounting electronic parts on a substrate, and data denoting the number of substrates to be manufactured; a control section 3 for controlling the operation of the electronic parts mounting machine based on the above-described program and discriminating the order of the occurrence of a parts shortage in each parts supply device, the time to the occurrence time of parts shortage, and the number of substrates which can be manufactured prior to the parts shortage; a display section 4 for displaying on a screen the results obtained by the control section 3; and an input section 5 for receiving a request for the advance notification of a parts shortage made by an operator.

Figure 2:
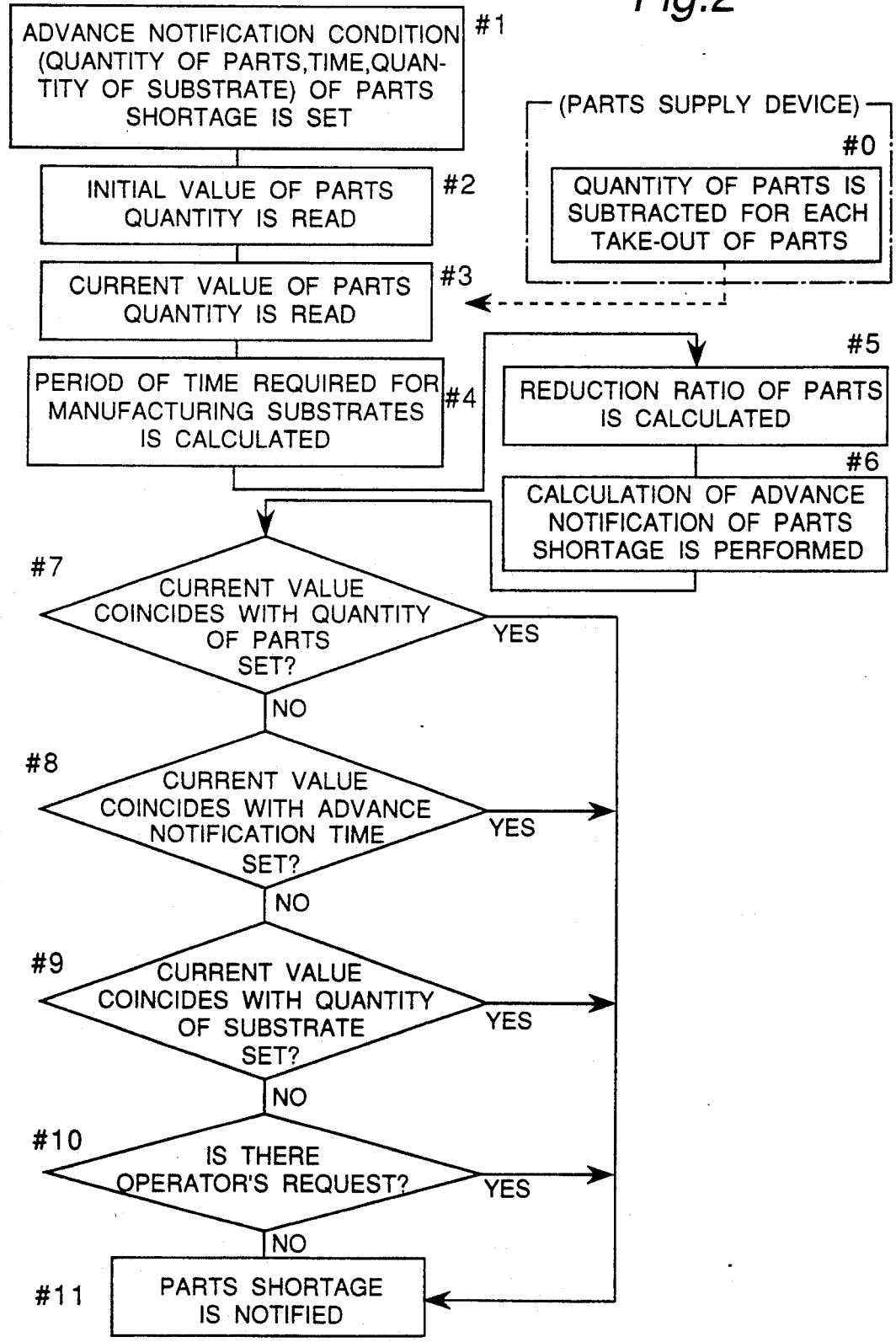
FIG. 2 is a flowchart showing the advance notification of an electronic parts shortage according to a first embodiment.

The processing flow of the advance notification of a parts shortage carried out in the above construction is described below with reference to the flowchart shown in FIG. 2.

Figure 7:
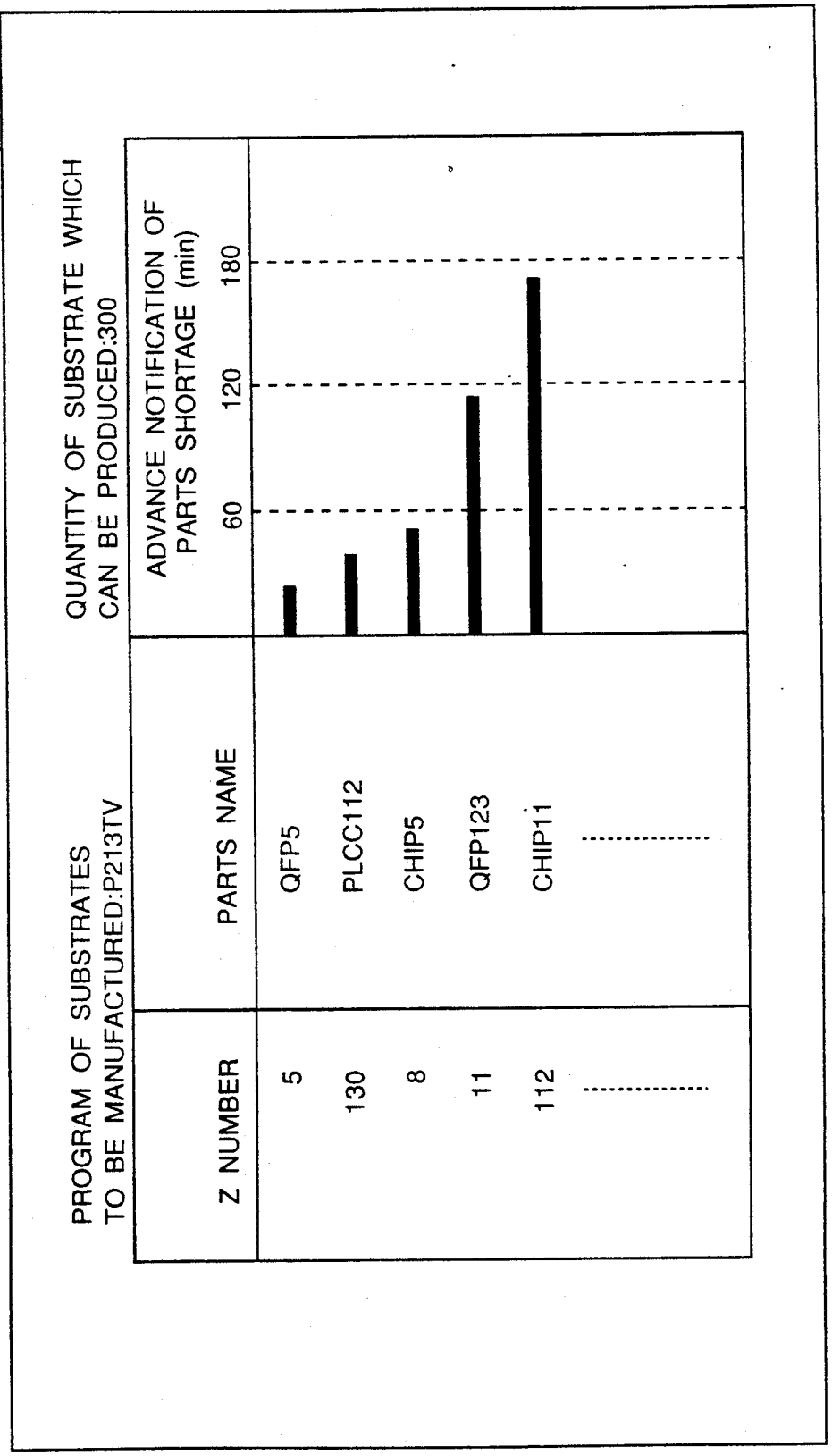
FIG. 7 is a display screen associated with the advance notification of an electronic parts shortage in the first, second, and third embodiments.
Figure 9:
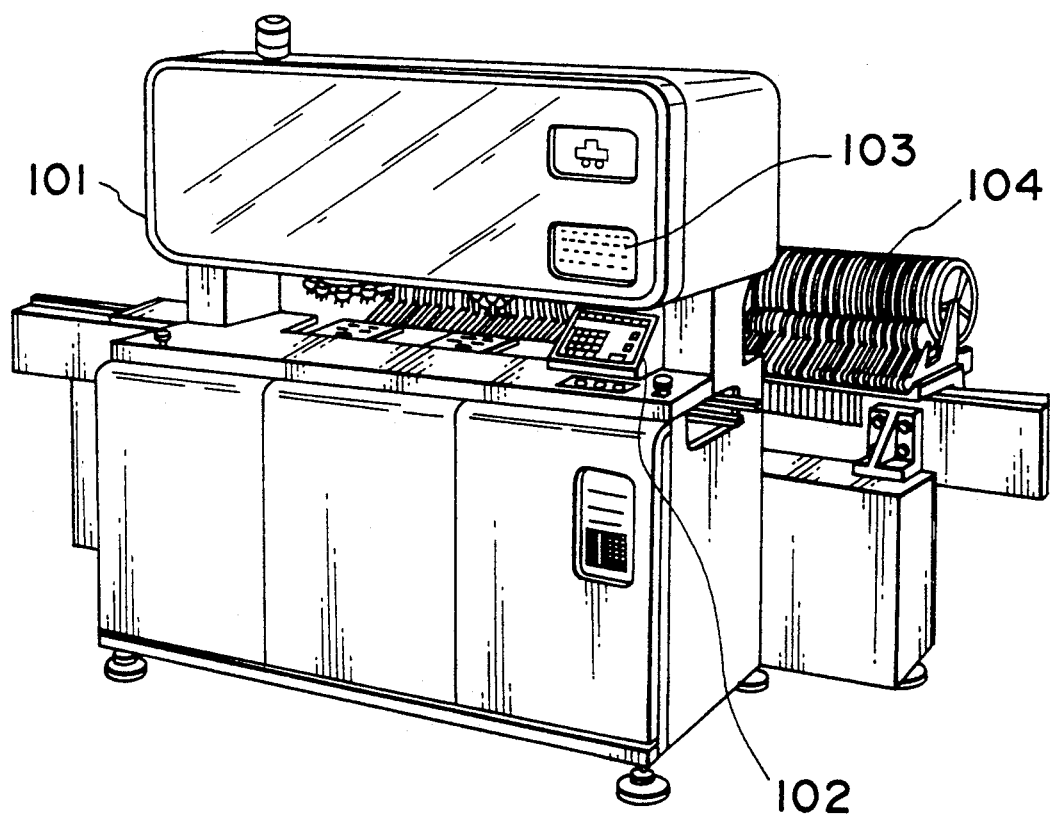
FIG. 9 is a perspective view showing an electronic parts mounting machine.

At step #0, the parts supply device subtracts "1" from an initial value each time a parts is taken out from the parts supply device and stores the value obtained by the subtraction. At step #1, the input section 5 receives the operator's input of the advance notification value of the number of remaining parts, the number of substrates to be manufactured, and the occurrence time of a parts shortage and the storing section 2 stores the advance notification value, the number of substrates, and the occurrence time. At step #2, the communicating section 1 reads the initial value of the quantity of parts held by each parts supply device prior to the start of manufacture and the storing section 2 stores each initial value. At step #3, the communicating section 1 reads out the current value of the quantity of parts held by each parts supply device for each parts mounting operation. At step #4, the control section 3 calculates the number of substrates to be manufactured and the period of time required for manufacturing one substrate. At step #5, based on the subtraction ratio of the current value of the quantity of parts held by each parts supply device read out at step #3 and the period of time for manufacturing one substrate calculated at step #4, the control section 3 calculates the reduction ratio of the quantity of parts held by each parts supply device per unit time required for manufacturing one substrate. At step #6, based on the initial value of the quantity of parts held by each parts supply device read out at step #2 and the reduction ratio of the quantity of parts calculated at step #5, the control section 3 calculates the order of the occurrence of a parts shortage in each parts supply device, the occurrence time of the parts shortage, and the number of substrates which can be manufactured. At step #7, the control section 3 compares the advance notification value of the number of remaining parts inputted at step #1 with the current value of the quantity of parts held by each parts supply device obtained at step #2. If there is a parts supply device in which the advance notification value coincides with the current value, the control section 3 provides a parts shortage advance notification on the display section 4 as shown in FIG. 7 based on the result obtained by the calculation performed at step #6. At step #8, the control section 3 carries out a parts shortage advance notification on the display section 4 as shown in FIG. 7 based on the result obtained by the calculation performed at step #6, if the advance notification time inputted at step #1 coincides with the current time. At step #9, the control section 3 makes a parts shortage advance notification on the display section 4 as shown in FIG. 7 based on the result obtained by the calculation performed at step #6, if the advance notification value of the number of substrates to be manufactured inputted at step #1 coincides with the number of substrates to be manufactured obtained at step #4.

Whether a parts shortage has occurred is checked during the parts mounting operation, when an instruction of a parts shortage advance notification is inputted to the electronic parts mounting machine. At step #10, the control section 3 makes a parts shortage advance notification on the display section 4 as shown in FIG. 7 based on the results obtained by the calculation performed at step #6.

As described above, according to this embodiment, the operator is given advance notification of the order of the occurrence of a parts shortage in each parts supply device and the occurrence time of the parts shortage during the parts mounting operation. Thus, the operator's parts shortage managing operation can be simplified and the operation rate can be improved by reducing the period of time for replacing one parts supply device with another due to the occurrence of a parts shortage. In addition the parts supply device stores the current value of the quantity of parts mounted thereon and the reduction ratio of the quantity of parts mounted thereon is calculated. Thus, accurate advance notification of a parts shortage can be effected.

A second embodiment of the present is described below with reference to FIG. 3.

Figure 3:
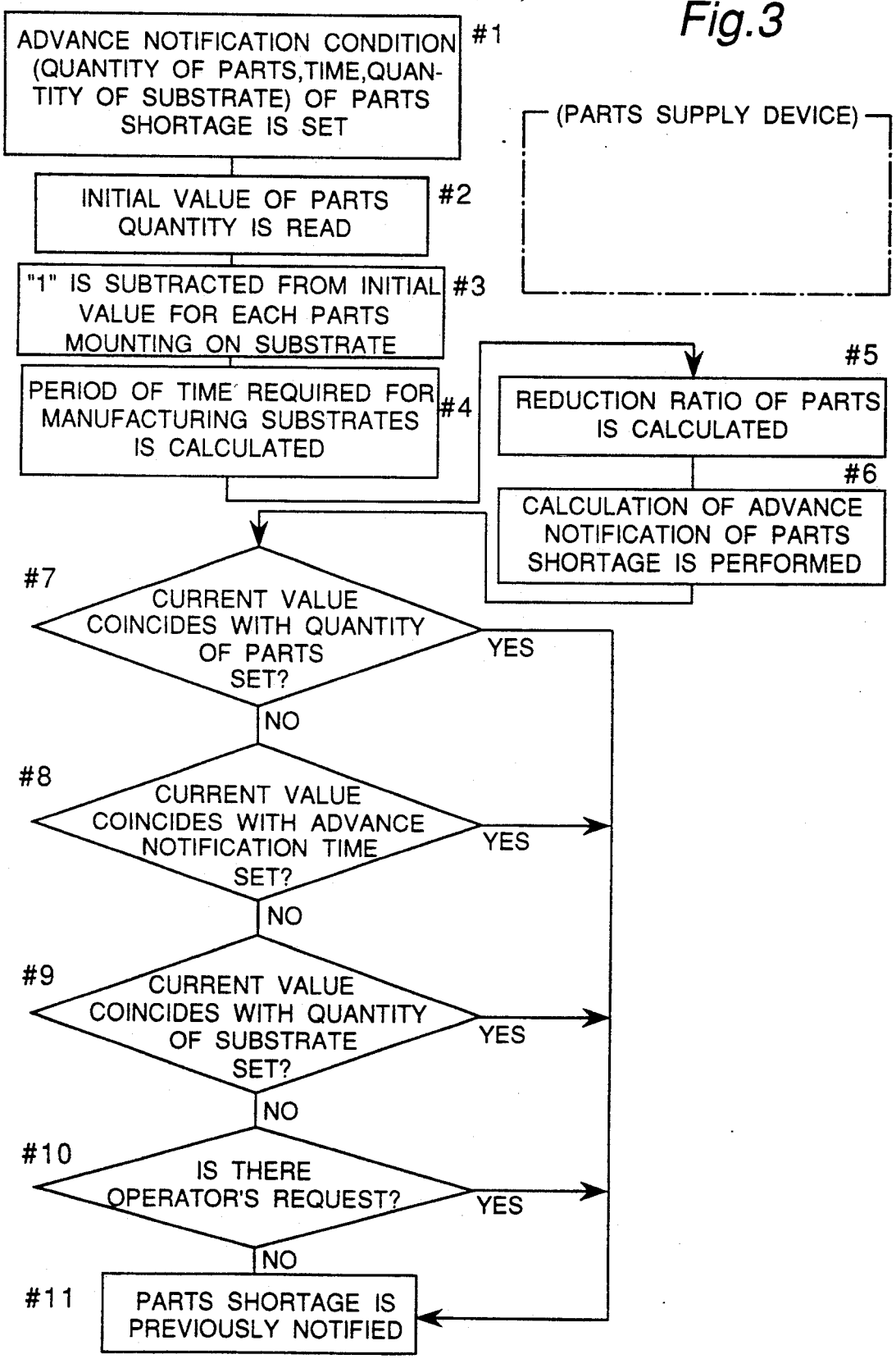
FIG. 3 is a flowchart showing the advance notification of an electronic parts shortage according to a second embodiment.

The method of the block diagram of FIG. 3 is similar to that of the first embodiment.

The processing flow of a part shortage advance notification is described below with reference to the flowchart of FIG. 3.

At step #1, the input section 5 receives the operator's input of the advance notification value of the number of remaining parts, the number of substrates to be manufactured, and the occurrence time of a parts shortage and the storing section 2 stores the advance notification value, the number of substrates, and the occurrence time. At step #2, the communicating section 1 reads the initial value of the quantity of parts held by each parts supply device prior to the start of manufacture and the storing section 2 stores each initial value. At step #3, the control section 3 subtracts "1" from an initial value for each parts mounting operation and then the storing section 2 stores the quantity of parts obtained as a result of the subtraction. At step #4, the control section 3 calculates the number of substrates to be manufactured and the period of time required for manufacturing one substrate. At step #5, based on the subtraction ratio of the current value of the quantity of parts held by each parts supply device read out at step #3 and the period of time for manufacturing one substrate calculated at step #4, the control section 3 calculates the reduction ratio of the quantity of parts held by each parts supply device per unit time required for manufacturing one substrate. At step #6, based on the initial value of the quantity of parts held by each parts supply device read out at step #2 and the reduction ratio of the quantity of parts calculated at step #5, the control section 3 calculates the order of the occurrence of a parts shortage in each parts supply device, the occurrence time of the parts shortage, and the number of substrates which can be manufactured. At step #7, the control section 3 compares the advance notification value of the number of remaining parts inputted at step #1 with the current value of the quantity of parts held by each parts supply device obtained at step #2. If there is a parts supply device in which the advance notification value coincides with the current value, the control section 3 provides a parts shortage advance notification on the display section 4 as shown in FIG. 7 based on the result obtained by the calculation performed at step #6. At step #8, the control section 3 carries out a parts shortage advance notification on the display section 4 as shown in FIG. 7 based on the result obtained by the calculation performed at step #6, if the advance notification time inputted at step #1 coincides with the current time. At step #9, the control section 3 makes a parts shortage advance notification on the display section 4 as shown in FIG. 7 based on the result obtained by the calculation performed at step #6, if the advance notification value of the number of substrates to be manufactured inputted at step #1 coincides with the number of substrates to be manufactured obtained at step #4.

Whether a parts shortage has occurred is checked during the parts mounting operation, when an instruction of a parts shortage advance notification is inputted to the electronic parts mounting machine. At step #10, the control section 3 provides a parts shortage advance notification on the display section 4 as shown in FIG. 7 based on the result obtained by the calculation performed at step #6.

As described above, according to the second embodiment, the operator is given advance notification of the order of the occurrence of a parts shortage in each parts supply device and the occurrence time of the parts shortage during the parts mounting operation. Thus, the operator's parts shortage managing operation can be simplified and the operation rate can be improved by reducing the period of time for replacing one parts supply device with another due to the occurrence of a parts shortage. In addition, the parts supply device stores the initial value of the quantity of parts mounted thereon and the reduction ratio of the quantity of parts mounted thereon is calculated. Thus, accurate advance notification of a parts shortage can be effected.

A third embodiment of the present is described below with reference to FIG. 4.

Figure 4:
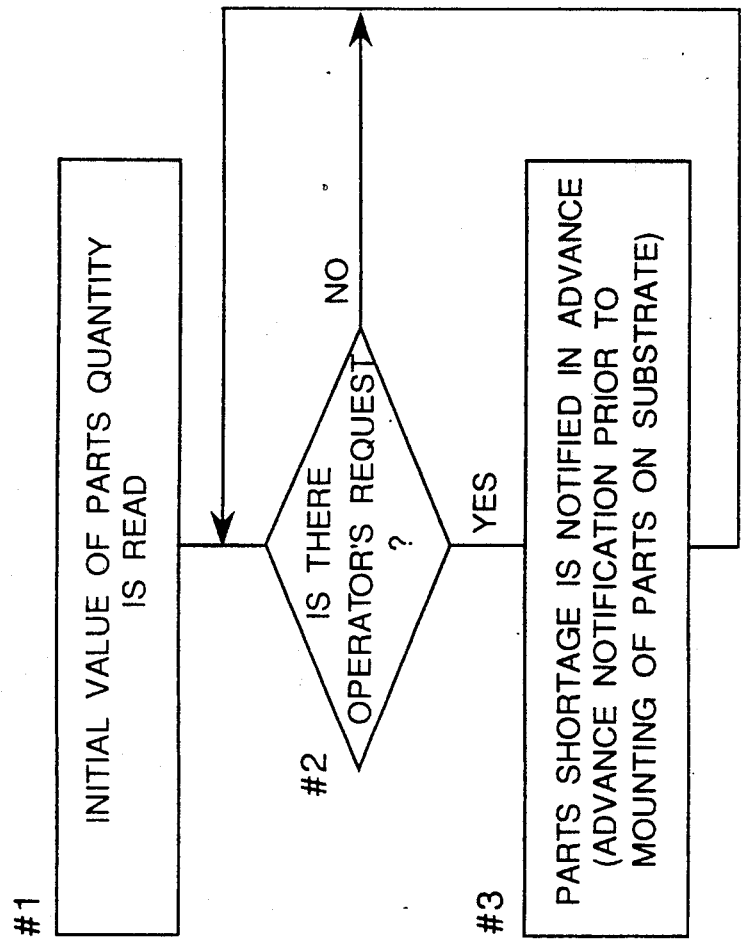
FIG. 4 is a flowchart showing the advance notification of an electronic parts shortage according to a third embodiment.

The method of the block diagram of FIG. 4 is similar to that of the first embodiment.

The processing flow of a parts shortage advance notification is described below with reference to the flowchart of FIG. 4.

At step #1, the communicating section 1 reads the initial value of the quantity of parts held by each parts supply device prior to the start of manufacture and then the storing section 2 stores each initial value. At step #2, when the operator checks whether a parts shortage has occurred before electronic parts mounting operation starts, the operator inputs a parts shortage advance notification instruction to the electronic parts mounting machine. At step #3, based on the initial value of each parts supply device read at step #1 and the production program stored in the storing section 2, the control section 3 calculates the occurrence time of an electronic parts shortage in each parts supply device, the order of the occurrence of the parts shortage, and the number of substrates which can be manufactured according to the quantity of parts using the program and the period of time required for mounting parts on a substrate, and a parts shortage advance notification is displayed on the display section 4 as shown in FIG. 7.

As described above, according to the third embodiment, the operator is given advance notification of the order of the occurrence of a parts shortage in each parts supply device and the occurrence time of the parts shortage before the parts mounting operation. Thus, the operator's parts shortage managing operation can be simplified and the operation rate can be improved by reducing the period of time for replacing one parts supply device with another due to the occurrence of a parts shortage. In addition, the parts supply device stores the initial value of the quantity of parts mounted thereon. Thus, accurate advance notification of a parts shortage can be effected.

A fourth embodiment of the present is described below with reference to FIG. 5.

Figure 5:
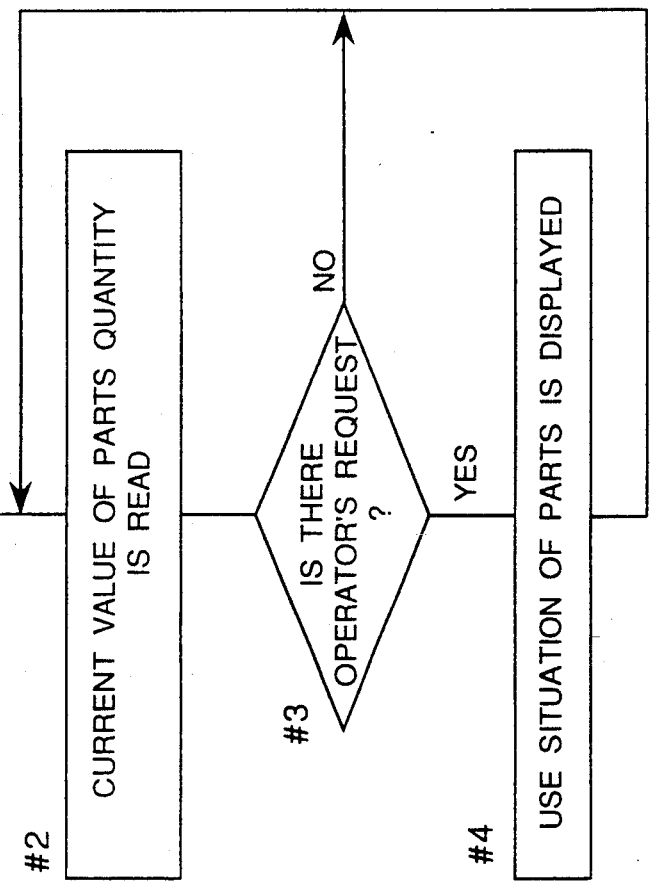
FIG. 5 is a flowchart showing the advance notification of an electronic parts shortage according to a fourth embodiment.

The method of the block diagram of FIG. 5 is similar to that of the first embodiment.

The processing flow of a part shortage advance notification is described below with reference to the flowchart of FIG. 5.

At step #0, at the parts supply device, an initial count value is reduced by "1" each time a parts is taken out the parts supply device from and the quantity of remaining parts is stored in a memory of the parts supply device. At step #1, the communicating section 1 reads the initial count value of the quantity of parts held by each parts supply device prior to the start of manufacture and the storing section 2 stores each initial count value. At step #2, the communicating section 1 reads out the current count value of the quantity of parts held by each parts supply device for each parts mounting operation.

At step #3, whether a parts shortage has occurred is checked during the parts mounting operation, when the instruction of a parts shortage advance notification is inputted to the electronic parts mounting machine. At step #4, based on the initial count value of the quantity of parts held by each parts supply device stored at step #1 and the current count value of the quantity of parts obtained at step #2, the control section 3 provides the display section 4 an instruction for displaying the use situation of parts of each parts supply device.

As described above, according to the fourth embodiment, the operator is given notification of the use situation of parts of each parts supply device is during the parts mounting operation. Thus, the operator's parts shortage managing operation can be simplified and the operation rate can be improved by reducing the period of time for replacing one parts supply device with another due to the occurrence of a parts shortage. In addition, the parts supply device stores the initial count value and the current count value of the quantity of parts mounted thereon. Thus, accurate advance notification of a parts shortage can be effected.

A fifth embodiment of the present is described below with reference to FIG. 6.

Figure 6:
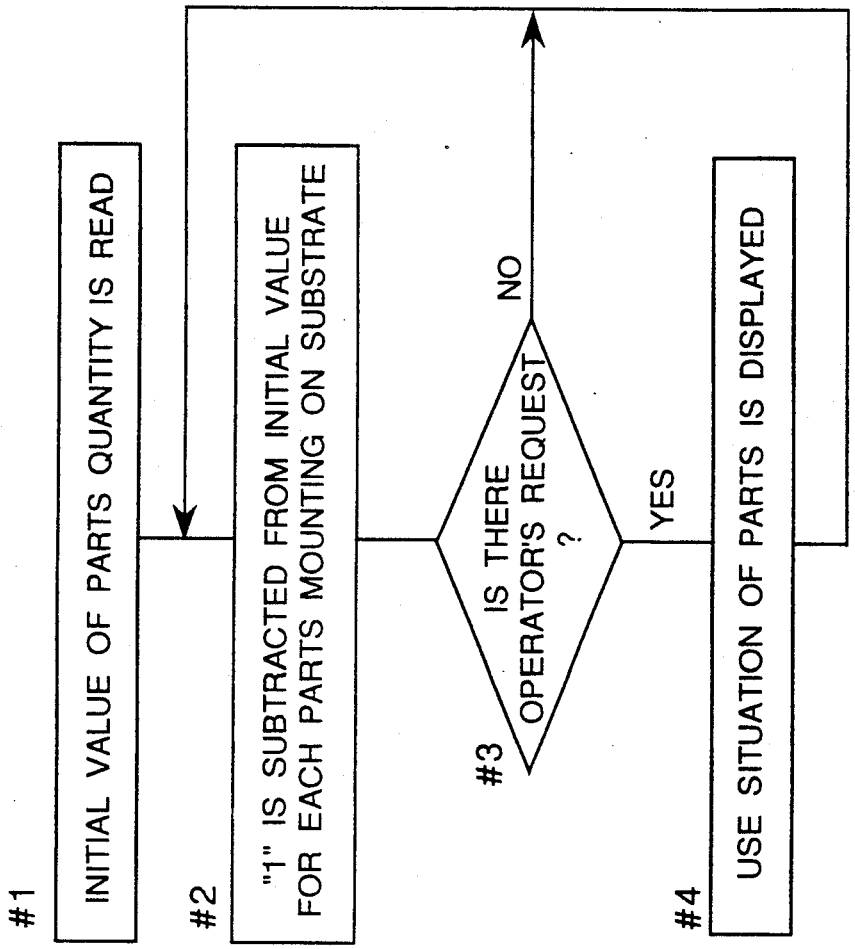
FIG. 6 is a flowchart showing the advance notification of an electronic parts shortage according to a fifth embodiment.

The method of the block diagram of FIG. 6 is similar to that of the first embodiment.

The flow of a part shortage advance notification is described below with reference to the flowchart of FIG. 6.

At step #1, the communicating section 1 reads the initial value of the quantity of parts held by each parts supply device prior to the start of manufacture and the storing section 2 stores each initial value. At step #2, the control section 3 subtracts "1" from an initial value for each parts mounting operation and then the storing section 2 stores the value obtained by the subtraction. At step #3, whether a parts shortage has occurred is checked during the parts mounting operation, when the instruction of a parts shortage advance notification is inputted to the electronic parts mounting machine. At step #4, based on the initial value of the quantity of parts held by each parts supply device stored at step #1 and the current value of the quantity of parts calculated at step #2, the control section 3 provides the display section 4 an instruction for displaying the use situation of parts of each parts supply device as shown in FIG. 8.

As described above, according to the fifth embodiment, the operator is given notification of the use situation of parts of each parts supply device during the parts mounting operation. Thus, the operator's parts shortage managing operation can be simplified and the operation rate can be improved by reducing the period of time for replacing one parts supply device with another due to the occurrence of a parts shortage. In addition, the parts supply device stores the initial value and the current value of the quantity of parts mounted thereon. Thus, accurate notification of a parts shortage can be effected.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A computer implemented method for providing advance notification of a parts shortage in an automatic mounting apparatus, said method comprising:

storing a quantity of electronic parts, contained in each of at least one parts supply device of the automatic mounting apparatus, in a respective memory associated with the at least one parts supply device;

repeatedly extracting the electronic parts from the at least one parts supply device and mounting the thus extracted electronic parts to a substrate in accordance with a production program of the automatic mounting apparatus;

responsive to each extraction of each electronic part from the at least one parts supply device, rewriting the quantity of electronic parts stored in the respective memory with a current quantity of electronic parts contained in each of the at least one parts supply device;

reading the current quantity of parts stored in the respective memory associated with the at least one parts supply device;

determining, based on the production program, at least one of a quantity of electronic parts to be mounted on the substrate and a period of time required for mounting the electronic parts on the substrate; and, providing an advance notification of a parts shortage of each of the at least one parts supply device based on the current quantity of parts read in said reading step and at least one of the quantity of electronic parts to be mounted and the period of time determined in said determining step.

2. The computer implemented method as claimed in claim 1, wherein the advance notification is indicative of an order of occurrence of a parts shortage among each parts supply device.

3. The computer implemented method as claimed in claim 1, wherein the advance notification is indicative of a time of occurrence of a parts shortage in each parts supply device.

4. The computer implemented method as claimed in claim 1, wherein the advance notification is indicative of a number of substrates which can be manufactured by the automatic mounting machine prior to a parts shortage.

5. The computer implemented method as claimed in claim 1, wherein parts shortage information is provided immediately after a request is made by an operator.

6. A computer implemented method for providing advance notification of a parts shortage in an automatic mounting apparatus, said method comprising:

storing a quantity of electronic parts, contained in each of at least one parts supply device of the automatic mounting apparatus, in a respective memory associated with the at least one parts supply device;

repeatedly extracting the electronic parts from the at least one parts supply device and mounting the thus extracted electronic parts to a substrate in accordance with a production program of the automatic mounting apparatus;

responsive to each extraction of each electronic part from the at least one part supply device, rewriting the quantity of electronic parts stored in the respective memory with a current quantity of electronic parts contained in each of the at least one parts supply device;

reading the current quantity of parts stored in the respective memory associated with the at least one parts supply device;

determining, based on the production program, a quantity of electronic parts to be mounted on the substrate; and providing an indication of the current quantity of parts read in said reading step and the quantity of electronic parts to be mounted as determined in said determining step to thereby provide an advance notification of a parts shortage of each of the at least one parts supply device.

7. A computer implemented method for providing advance notification of a parts shortage in an automatic mounting apparatus:

storing an initial quantity of electronic parts, contained in each of the at least one parts supply device, in a respective memory associated with the at least one parts supply device;

repeatedly extracting the electronic parts from the at least one parts supply device and mounting the thus extracted electronic parts to a substrate in accordance with a production program of the automatic mounting apparatus;

responsive to each extraction of each electronic part from the at least one parts supply device, rewriting the quantity of electronic parts stored in the respective memory with a current quantity of electronic parts contained in each of the at least one parts supply device;

reading the initial quantity and the current quantity stored in the respective memory associated with the at least one parts supply device;

determining a reduction ratio denoting a quantity of electronic parts to be mounted on each successive substrate for each of the at least one parts supply device; and, providing an advance notification of a parts shortage of each of the at least one parts supply device based on the current quantity of parts read in said reading step and the reduction ratio determined in said determining step.

8. The computer implemented method as claimed in claim 7, wherein the advance notification is indicative of an order of occurrence of a parts shortage among each parts supply device.

9. The computer implemented method as claimed in claim 7, wherein the advance notification is indicative of a time of occurrence of a parts shortage in each parts supply device.

10. The computer implemented method as claimed in claim 7, wherein the advance notification is indicative of a number of substrates which can be manufactured by the automatic mounting machine prior to a parts shortage.

11. The computer implemented method as claimed in claim 7, wherein parts shortage information is provided immediately after a request is made by an operator and wherein the advance notification is provided immediately after a parts shortage condition set by the operator is satisfied.

12. A computer implemented method for providing advance notification of a parts shortage in an automatic mounting apparatus, said method comprising:

storing a current quantity of electronic parts, contained in each of at least one parts supply device of the automatic mounting apparatus, in a respective memory associated with the at least one parts supply device;

repeatedly extracting the electronic parts from the at least one parts supply device and mounting the thus extracted electronic parts to a substrate in accordance with a production program of the automatic mounting apparatus;

reading the current quantity of parts stored in the respective memory associated with the at least one parts supply device;

determining, based on the production program, at least one of a quantity of electronic parts to be mounted on the substrate and a period of time required for mounting the electronic parts on the substrate; and providing an advance notification of a parts shortage of each of the at least one parts supply device based on the current quantity of parts read in said reading step and at least one of the quantity of electronic parts to be mounted and the period of time determined in said determining step.

* * * * *